US012578649B2

(12) United States Patent
Im et al.

(10) Patent No.: US 12,578,649 B2
(45) Date of Patent: Mar. 17, 2026

(54) BAKE UNIT, OPERATION METHOD THEREOF, AND PHOTO SPINNER EQUIPMENT HAVING THE BAKE UNIT

(71) Applicant: SEMES CO., LTD., Cheonan-si (KR)

(72) Inventors: Kyung Taek Im, Cheonan-si (KR); Ji Yoon Chung, Cheonan-si (KR)

(73) Assignee: SEMES CO., LTD., Cheonan-si (KR)

( * ) Notice: Subject to any disclaimer, the term of this patent is extended or adjusted under 35 U.S.C. 154(b) by 159 days.

(21) Appl. No.: 18/241,892

(22) Filed: Sep. 3, 2023

(65) Prior Publication Data

US 2024/0103376 A1 Mar. 28, 2024

(30) Foreign Application Priority Data

Sep. 27, 2022 (KR) ........................ 10-2022-0122603

(51) Int. Cl.
*G03F 7/40* (2006.01)

(52) U.S. Cl.
CPC ..................................... *G03F 7/40* (2013.01)

(58) Field of Classification Search
CPC ................ G03F 7/40; H01L 21/67103; H01L 21/67109; H01L 21/6715; H01L 21/67225; H01L 21/67742; H01L 21/67745; H01L 21/67754; H01L 21/67757; H01L 21/68707
See application file for complete search history.

(56) References Cited

U.S. PATENT DOCUMENTS

| | | | |
|---|---|---|---|
| 5,935,768 A | 8/1999 | Biche et al. | |
| 6,089,763 A | 7/2000 | Choi et al. | |
| 7,284,917 B2 * | 10/2007 | Ishida | H01L 21/67178 |
| | | | 396/611 |
| 11,060,890 B2 * | 7/2021 | Kamiya | G01D 5/2405 |
| 11,705,359 B2 * | 7/2023 | Ide | H01L 21/67196 |
| | | | 414/751.1 |
| 2007/0068920 A1 | 3/2007 | Kang | |
| 2013/0052599 A1 | 2/2013 | Toyozawa | |
| 2022/0051926 A1 | 2/2022 | Han et al. | |

FOREIGN PATENT DOCUMENTS

| | | |
|---|---|---|
| KR | 10-0234816 | 2/1995 |
| KR | 10-1999-024866 | 4/1999 |
| KR | 10-0637717 | 10/2006 |
| KR | 10-2013-0024808 | 3/2013 |
| KR | 10-2018-0100281 | 9/2018 |
| KR | 10-2022-0021295 | 2/2022 |

OTHER PUBLICATIONS

Office Action from the Korean Intellectual Property Office dated Jun. 27, 2024.

* cited by examiner

*Primary Examiner* — Hung V Nguyen

(57) ABSTRACT

Proposed is a bake unit capable of rapid thermal treatment, an operation method of the bake unit, and photo spinner equipment. The bake unit that performs a thermal process on a substrate in the photo spinner equipment includes a heater for heating the substrate, a chiller for cooling the substrate, a substrate transfer robot for transferring the substrate, and a controller controlling an operation of the substrate transfer robot. The substrate transfer robot includes an arm base configured to be able to move up and down in a vertical direction, and an upper arm and a lower arm coupled to the arm base to move up and down together but be independently horizontally driven.

6 Claims, 19 Drawing Sheets

Figure 13:
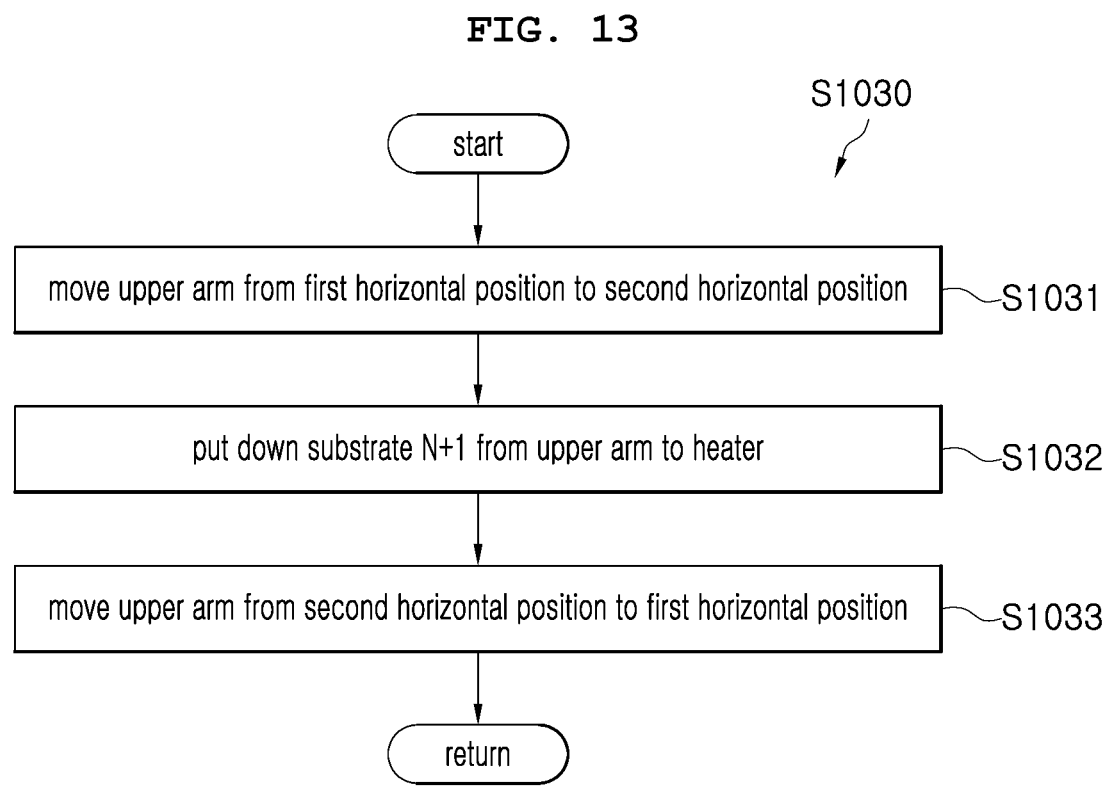

```
        ┌──────────┐
        │  start   │
        └──────────┘
             │
             ▼
┌─────────────────────────────────────────────────────────────────┐
│ move upper arm from first horizontal position to second          │   S1031
│ horizontal position                                              │
└─────────────────────────────────────────────────────────────────┘
             │
             ▼
┌─────────────────────────────────────────────────────────────────┐
│        put down substrate N+1 from upper arm to heater           │   S1032
└─────────────────────────────────────────────────────────────────┘
             │
             ▼
┌─────────────────────────────────────────────────────────────────┐
│ move upper arm from second horizontal position to first          │   S1033
│ horizontal position                                              │
└─────────────────────────────────────────────────────────────────┘
             │
             ▼
        ┌──────────┐
        │  return  │
        └──────────┘
```

BAKE UNIT, OPERATION METHOD THEREOF, AND PHOTO SPINNER EQUIPMENT HAVING THE BAKE UNIT

CROSS REFERENCE TO RELATED APPLICATION

The present application claims priority to Korean Patent Application No. 10-2022-0122603, filed Sep. 27, 2022, the entire contents of which is incorporated herein for all purposes by this reference.

BACKGROUND OF THE INVENTION

Field of the Invention

The present disclosure relates to a bake unit that performs a thermal process on a substrate in photo spinner equipment, an operation method of the bake unit, and the photo spinner equipment.

Description of the Related Art

The semiconductor manufacturing process is a process of manufacturing semiconductor products capable of processing electrical signals. Semiconductor manufacturing is broadly divided into the "pre-process (front-end)" and "post-process (back-end)". The pre-process involves forming a pattern on a wafer (substrate) through processing steps such as oxidation, exposure, etching, ion implantation, and deposition. The back-end process refers to a packaging process for manufacturing a semiconductor package in the form of a finished product through steps such as wafer dicing, die bonding, wiring, molding, marking, and testing of patterned wafers. In order to perform each manufacturing process, semiconductor manufacturing equipment for performing individual processes is provided in cleanrooms of a semiconductor manufacturing plant so that a process is performed on a substrate put into the semiconductor manufacturing equipment. In particular, photolithography for imprinting a specific pattern on a substrate is very important in semiconductor's miniaturization.

The photolithography process can be broken down into three steps: coating, exposure, and development. Photo spinner equipment is coupled to an exposure equipment (e.g., a scanner) that performs an exposing process, and a pre-exposure coating process and a post-exposure developing process are performed in the photo spinner equipment. Meanwhile, baking for thermal processing of a substrate before or after exposure is performed. In the bake process, thermal energy is applied to the substrate to heat-treat a developer (photoresist, PR) on the substrate. A bake unit that performs the bake process is provided in the photo spinner equipment.

In order to increase manufacturing efficiency, it is required to increase substrate throughput per unit time in photo spinner equipment. However, the bake process requires a long time for thermal treatment and cooling of a substrate. Therefore, there is a need for a method that enables more rapid thermal processing of the substrate.

SUMMARY OF THE INVENTION

Accordingly, the present disclosure has been made keeping in mind the above problems occurring in the related art, and the present disclosure is intended to provide a bake unit capable of performing a thermal process rapidly, an operation method of the bake unit, and photo spinner equipment.

In order to achieve the above objective, according to an embodiment of the present disclosure, there is provided a bake unit that performs a thermal process on a substrate in photo spinner equipment. The bake unit includes: a heater configured to heat the substrate; a chiller configured to cool the substrate; a substrate transfer robot configured to transfer the substrate; and a controller configured to control an operation of the substrate transfer robot. The substrate transfer robot may include: an arm base configured to be able to move up and down in a vertical direction; and an upper arm and a lower arm coupled to the arm base to move up and down together but be independently horizontally driven.

According to the embodiment of the present disclosure, the substrate transfer robot may further include a drive part that drives the substrate transfer robot.

According to the embodiment of the present disclosure, the drive part may include: an upper arm drive part configured to move the upper arm along a horizontal direction; a lower arm drive part configured to move the lower arm in the horizontal direction; and a vertical drive part configured to move the arm base along the vertical direction.

According to the embodiment of the present disclosure, the upper aim drive part and the lower arm drive part may be respectively provided on each side of the base plate with the chiller as the center.

According to the embodiment of the present disclosure, the vertical drive part may be configured to vertically move the upper arm and the lower arm together by raising or lowering the arm base.

According to the embodiment of the present disclosure, the upper arm drive part and the lower arm drive part may be configured so that the upper arm and the lower arm move back and forth between a first horizontal position where the chiller is located and a second horizontal position where the heater is located.

According to an embodiment of the present disclosure, there is provided an operation method of a bake unit that performs a thermal process on a substrate in photo spinner equipment. The bake unit may include: a heater configured to heat the substrate; a chiller configured to cool the substrate; a substrate transfer robot configured to transfer the substrate; and a controller configured to control an operation of the substrate transfer robot. The substrate transfer robot may include: an arm base configured to be able to move up and down in a vertical direction; and an upper arm and a lower arm coupled to the arm base to move up and down together but be independently horizontally driven. A process executed by the controller may include: placing a first substrate on the heater using the upper aim; positioning the first substrate from the heater to the chiller using the lower arm; and placing a second substrate on the heater using the upper arm.

According to the embodiment of the present disclosure, the placing a first substrate on the heater may include: detecting the first substrate seated on the upper arm; moving the upper arm from the first horizontal position to the second horizontal position; putting down the first substrate from the upper arm to the heater; and moving the upper arm from the second horizontal position to the first horizontal position.

According to the embodiment of the present disclosure, the positioning the first substrate from the heater to the chiller using the lower arm may include: detecting the second substrate seated on the upper arm; lifting the arm base from the first vertical position to the second vertical position; moving the lower arm from the first horizontal position to the second horizontal position; picking up the first substrate from the heater to the lower arm; moving the lower arm from the second horizontal position to the first horizontal position; and lowering the arm base from the second vertical position to the first vertical position.

According to the embodiment of the present disclosure, the placing a second substrate on the heater using the upper arm may include: moving the upper arm from the first horizontal position to the second horizontal position; putting down the second substrate from the upper arm to the heater; and moving the upper arm from the second horizontal position to the first horizontal position.

According to the embodiment of the present disclosure, a robot hand transferring the substrate in the photo spinner equipment may place the second substrate on the upper arm.

According to the embodiment of the present disclosure, the robot hand may descend from a position above the upper arm to a position therebelow to place the second substrate on the upper arm.

According to the embodiment of the present disclosure, the robot hand may pick up the first substrate located on the chiller and discharge the first substrate to the outside of the bake unit.

According to the embodiment of the present disclosure, the robot hand may rise from a position below the chiller to a position thereabove to pick up the first substrate.

According to an embodiment of the present disclosure, there is provided a photo spinner equipment including: an index module configured to transport a substrate from a container in which the substrate is stored; a treating module configured to perform a coating process and a developing process on the substrate, and includes a bake unit that performs a thermal process on the substrate; and an interface module configured to connect the treating module with external exposure equipment. The bake unit may include: a heater configured to heat the substrate; a chiller configured to cool the substrate; a substrate transfer robot configured to transfer the substrate between the heater and the chiller; and a controller configured to control an operation of the substrate transfer robot. The substrate transfer robot may include: an arm base configured to be able to move up and down in a vertical direction; and an upper arm and a lower arm coupled to the arm base to move up and down together but be independently horizontally driven.

According to the present disclosure, an upper arm and a lower arm for transferring substrates in a bake unit are configured to move up and down together but be independently horizontally driven, heating and cooling for each of the two substrates can be simultaneously performed in one bake unit, and thus a thermal process can be performed more rapidly.

BRIEF DESCRIPTION OF THE DRAWINGS

The above and other objectives, features, and other advantages of the present disclosure will be more clearly understood from the following detailed description when taken in conjunction with the accompanying drawings, in which:

FIG. 8 is a view showing a process of putting down a substrate from a robot hand of a transport robot to an upper arm;

FIG. 9 is a view showing a process of picking up a substrate with the robot hand of the transport robot from a chiller;

FIGS. 10 to 13 are flowcharts showing an operation method of the bake unit according to the present disclosure.

DETAILED DESCRIPTION OF THE INVENTION

Figure 1:
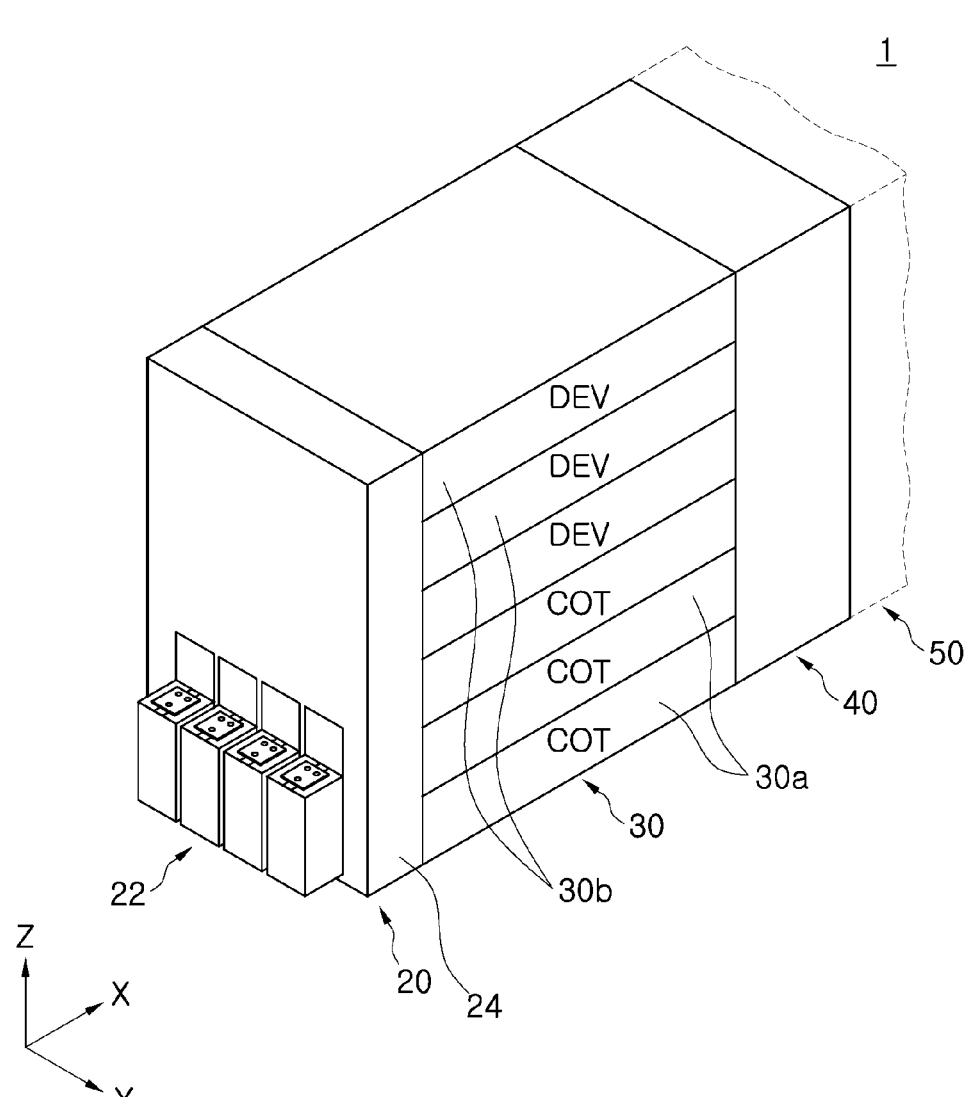
FIG. 1 schematically shows the appearance of photo spinner equipment to which the present disclosure may be applied.

Hereinafter, with reference to the accompanying drawings, embodiments of the present disclosure will be described in detail so that those skilled in the art may easily carry out the present disclosure. The present disclosure may be embodied in many different forms and is not limited to the embodiments set forth herein.

In order to clearly describe the present disclosure, parts irrelevant to the description are omitted, and the same reference numerals are assigned to the same or similar components throughout the specification.

In addition, in various embodiments, components having the same configuration will be described only in representative embodiments by using the same reference numerals, and in other embodiments, only configurations different from the representative embodiments will be described.

Throughout the specification, when a part is said to be "connected (or coupled)" to another part, this includes not only the case of being "directly connected (or coupled)" but also "indirectly connected (or coupled)" with another member in between. In addition, when a part "includes", "has", or "comprises" a certain part, this means that other components may be further included without excluding other components unless otherwise stated.

Unless otherwise defined, all terms used herein, including technical or scientific terms, have the same meaning as commonly understood by a person skilled in the art. Terms such as those defined in the commonly used dictionaries should be construed as having meanings consistent with the meanings in the context of the related art and shall not be construed in ideal or excessively formal meanings unless expressly defined in this application.

Figure 2:
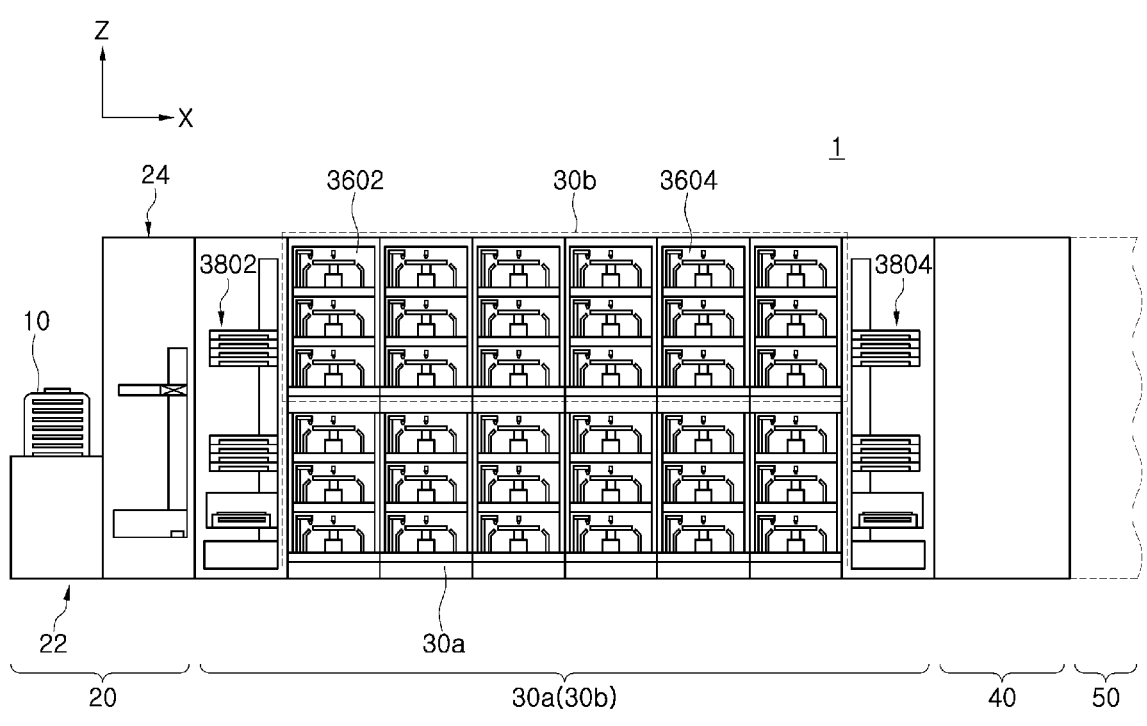
FIG. 2 shows the schematic layout of the photo spinner equipment.

FIG. 1 schematically shows the appearance of photo spinner equipment 1 to which the present disclosure may be applied; FIG. 2 shows the schematic layout of the photo spinner equipment 1; and FIG. 3 shows a coating block 30*a* of the photo spinner equipment 1.

Figure 3:
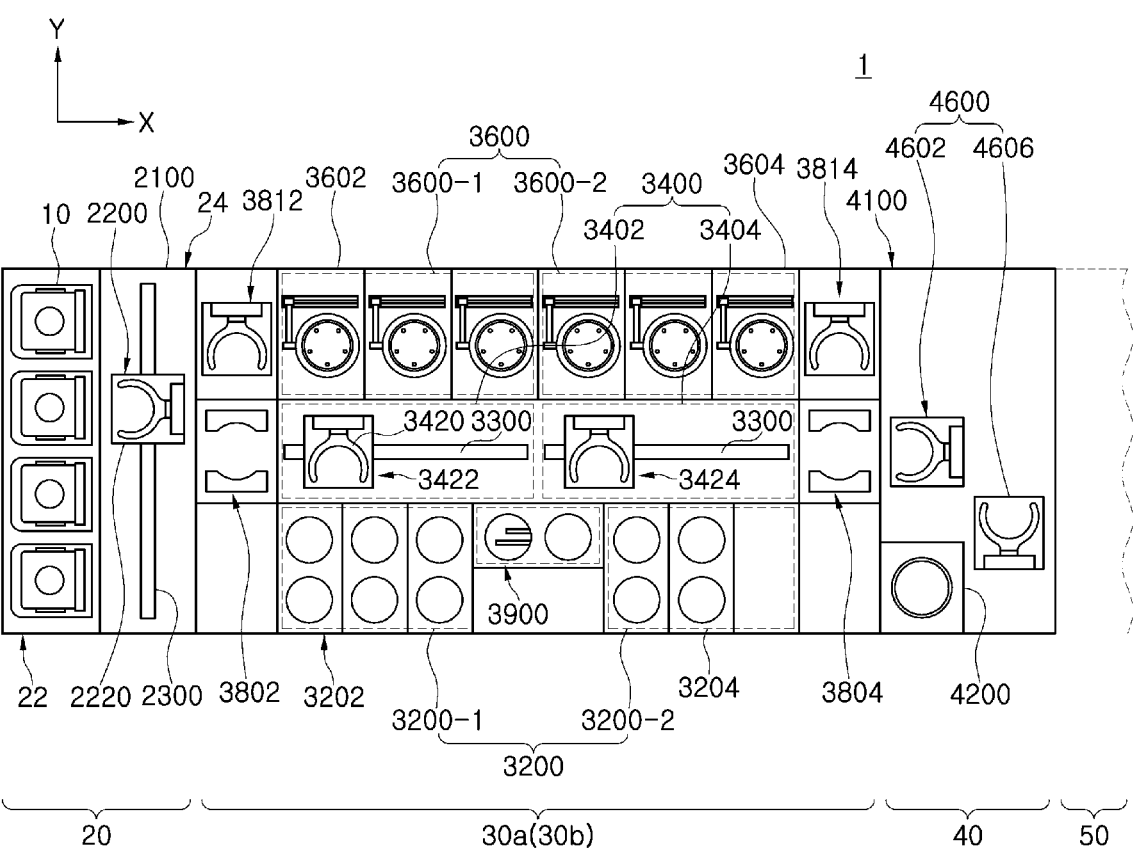
FIG. 3 shows a coating block of the photo spinner equipment.

Referring to FIGS. 1 to 3, the photo spinner equipment 1 includes: an index module 20 that transports a substrate from a container 10 in which the substrate is stored; a treating module 30 that performs a coating process and a developing process on the substrate and includes a bake unit 3200 or 100 performing a thermal process on the substrate; and an interface module 40 that connects the treating module 30 with external exposure equipment 50.

The index module 20, the treating module 30, and the interface module 40 may be sequentially arranged in a line. Hereinafter, the direction in which the index module 20, the treating module 30, and the interface module 40 are arranged is defined as a first horizontal direction X, the direction perpendicular to the first horizontal direction X is defined as a second horizontal direction Y when viewed from above, and the direction perpendicular to both the first horizontal direction X and the second horizontal direction Y is defined as a vertical direction Z.

The index module 20 transports a substrate from the container 10 in which the substrate is stored to the treating module 30, and stores the treated substrate into the container 10. The longitudinal direction of the index module 20 is provided as the second horizontal direction Y. The index module 20 has a load port 22 and an index frame 24. Based on the index frame 24, the load port 22 is located on the opposite side of the treating module 30. The container 10 in which the substrates are stored is placed in the load port 22. A plurality of load ports 22 may be provided, and the plurality of load ports 22 may be arranged along the second horizontal direction Y.

As the container 10, an airtight container such as a front opening unified pod (FOUP) may be used. The container 10 may be placed in the load port 22 by a transport means (not shown) such as an overhead transfer, overhead conveyor, or automatic guided vehicle or by an operator.

An index robot 2200 is provided inside the index frame 24. A guide rail 2300 with its longitudinal direction along the second horizontal direction Y is provided inside the index frame 24, and the index robot 2200 may be provided to be movable on the guide rail 2300. The index robot 2200 may include a hand 2220 on which the substrate is placed, and the hand 2220 may move forward and backward, rotate about the vertical direction Z as an axis, and move along the vertical direction Z.

The treating module 30 performs a coating process and a developing process on the substrate.

The treating module has a coating block 30a and a developing block 30b. The coating block 30a performs a coating process on the substrate, and the developing block 30b performs a developing process on the substrate. A plurality of coating blocks 30a are provided, and the coating blocks 30a are provided stacked on top of each other. A plurality of developing blocks 30b are provided, and the developing blocks 30b are provided stacked on top of each other.

According to the embodiment of FIG. 1, three coating blocks 30a are provided, and three developing blocks 30b are provided. The coating blocks 30a may be disposed below the developing blocks 30b. As an example, the plurality of coating blocks 30a may perform the same process and be provided with the same structure. In addition, the plurality of developing blocks 30b may perform the same process and be provided with the same structure. However, the arrangement and configuration of the coating block 30a and the developing block 30b in the photo spinner equipment 1 to which the present disclosure may be applied is not limited to the structure shown in FIG. 1, and various changes may be applied.

Referring to FIG. 2, the coating block 30a includes: a bake unit 3200, a transport part 3400, and a liquid treating part 3600.

The transport part 3400 transports the substrates between the bake unit 3200 and the liquid treating part 3600 within the coating block 30a. The transport part 3400 may include a first transport section 3402 as a first movement passage and a second transport section 3404 as a second movement passage. The first and second transport sections 3402 and 3404 are provided in a longitudinal direction parallel to the first horizontal direction X and connected to each other. First and second transport robots 3422 and 3424 are provided in the first and second transport sections 3402 and 3404, respectively.

As an example, the first and second transport robots 3422 and 3424 have a robot hand 3420 on which the substrate is placed, and the robot hand 3420 may move forward and backward, rotate about the vertical direction Z as an axis, and move along the vertical direction Z. A guide rail 3300 whose longitudinal direction is parallel to the first horizontal direction X is provided in each of the first and second transport sections 3402 and 3404, and the transport robots 3422 and 3424 may be movable on the guide rail 3300.

Referring to FIG. 2, the first and second transport sections 3402 and 3404 may be provided with the same structure. The first transport section 3402 is located closer to the index module 20, and the second transport section 3404 is located closer to the interface module 40.

The bake unit 3200 performs a thermal process on the substrate. The thermal process may include a cooling process and a heating process. The liquid treating part 3600 supplies liquid to the substrate to form a liquid film. The liquid film may be a photoresist film or an anti-reflection film.

The liquid treating part 3600 may include: a first liquid treating part 3600-1 having liquid treating chambers for applying an anti-reflection film to a substrate; and a second liquid treating part 3600-2 having liquid treating chambers for applying a photoresist film to a substrate coated with an anti-reflection film. The first liquid treating part 3600-1 is disposed on one side of the first transport section 3402 while the second liquid treating part 3600-2 is disposed on one side of the second transport section 3404.

The liquid treating part 3600 has a plurality of liquid treating chambers 3602 and 3604. The plurality of liquid treating chambers 3602 and 3604 may be disposed along the longitudinal direction of the transport part 3400. In addition, some of the liquid treating chambers 3602 and 3604 may be provided to be stacked on top of each other.

The bake unit 3200 may include: a first bake unit 3200-1 having thermal processing chambers 3202 for thermal processing of a substrate in connection with the application of the anti-reflection film; and a second bake unit 3200-2 having thermal processing chambers 3204 for thermal processing of a substrate in connection with the application of the photoresist film. The first bake unit 3200-1 is disposed on one side of the first transport section 3402, while the second bake unit 3200-2 is disposed on one side of the second transport section 3404. The thermal processing chambers 3202 disposed on the side of the first transport section 3402 are referred to as front thermal processing chambers, and the thermal processing chambers 3204 disposed on the side of the second transport section 3404 are referred to as rear thermal processing chambers.

That is, the first liquid treating part 3600-1 and the first bake unit 3200-1 for forming an anti-reflection film on a substrate are disposed in the first transport section 3402, while the second liquid treating part 3600-2 and the second bake unit 3200-2 for forming a photoresist film on a substrate are disposed in the second transport section 3404.

Meanwhile, the treating module 30 includes a plurality of buffer chambers 3802 and 3804. Some of the buffer chambers 3802 among the plurality of buffer chambers 3802 and 3804 are disposed between the index module 20 and the transport part 3400. The buffer chamber 3802 may be referred to as a front buffer. The plurality of buffer chambers 3802 are provided and positioned to be stacked on top of each other in the vertical direction Z. Some other buffer chambers 3804 among the plurality of buffer chambers 3802 and 3804 are disposed between the transport part 3400 and the interface module 40. The buffer chamber 3804 may be referred to as a rear buffer. The plurality of buffer chambers 3804 are provided and positioned to be stacked on top of each other in the vertical direction Z. The buffer chambers 3802 and 3804 temporarily store the substrates. Meanwhile, buffer transport robots 3812 and 3814 for transporting substrates may be provided in the buffer chambers 3802 and 3804.

An interface buffer 4100 provides a space where the substrates transported between the coating block 30*a*, an additional process chamber 4200, an exposure equipment 50, and the developing block 30*b* temporarily stays during transport. A plurality of interface buffers 4100 are provided, and the plurality of interface buffers 4100 may be stacked on top of each other.

A transport member 4600 transports the substrates between the coating block 30*a*, the additional process chamber 4200, the exposure equipment 50, and the developing block 30*b*. The transport member 4600 may be provided as one or a plurality of robots. As an example, the transport member 4600 may include a first interface robot 4602 and a second interface robot 4606.

The first interface robot 4602 may transport the substrates between the coating block 30*a*, the additional process chamber 4200, and the interface buffer 4100, while the second interface robot 4606 may transport the substrates between the interface buffer 4100 and the exposure equipment 50.

Hands of the index robot 2200, the first interface robot 4602, and the second interface robot 4606 may all be provided in the same shape as the robot hands 3420 of the transport robots 3422 and 3424. Alternatively, the hand of the robot that directly transports the substrate to and from a transport plate of the thermal processing chamber may be provided in the same shape as the robot hands 3420 of the transport robots 3422 and 3424, and the hands of the other robots may be provided in a different shape.

Referring to FIG. 2, a cooling transport module 3900 is provided for transporting substrates between the first transport robot 3422 and the second transport robot 3424, and for substrate cooling. The cooling transport module 3900 is disposed in the bake unit 3200 adjacent to the boundary where the first movement path of the first transport robot 3422 and the second movement path of the second transport robot 3424 come into contact with each other. The cooling transport module 3900 may be stacked in multiple stages like the thermal processing chambers.

Hereinafter, the bake unit 100 of the photo spinner equipment 1 according to the present disclosure will be described. The bake unit 100 of the present disclosure may be applied to the bake unit 3200 of FIG. 2.

Figure 4:
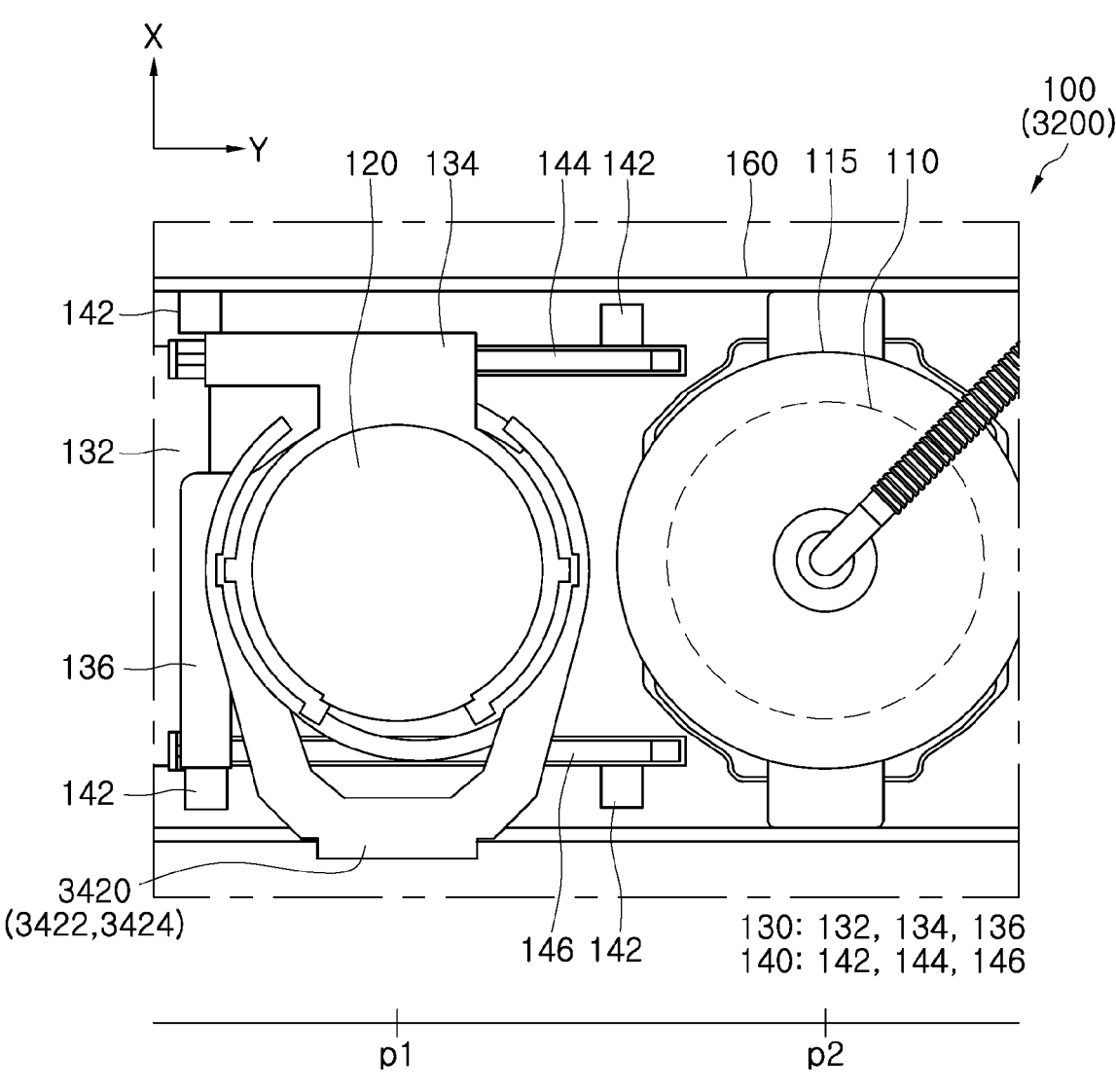
FIG. 4 shows a bake unit viewed from above.
Figure 5:
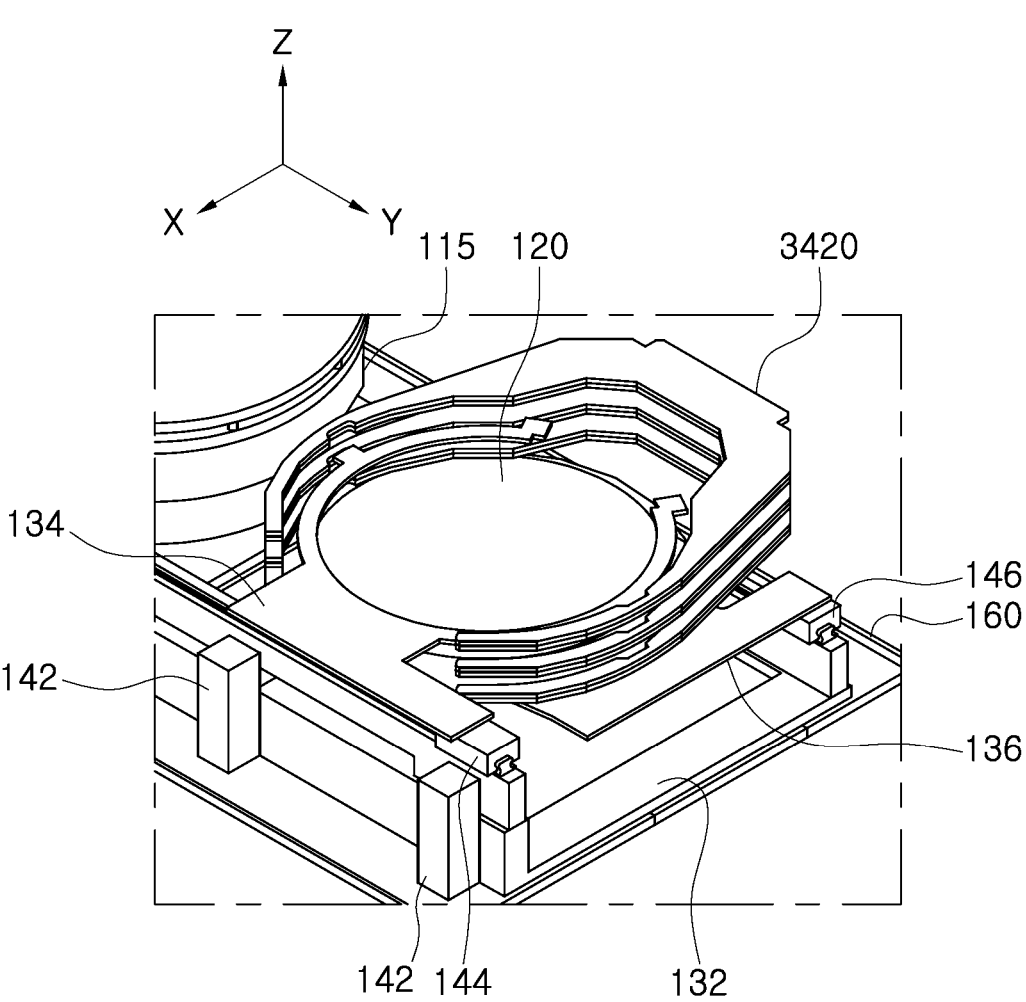
FIG. 5 is a perspective view of the bake unit.
Figure 6:
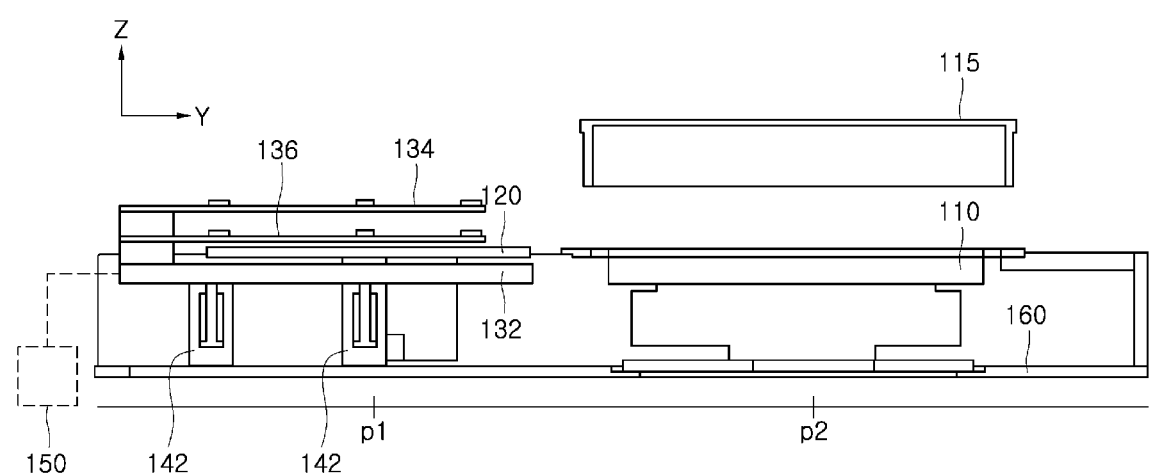
FIG. 6 shows the bake unit viewed from the side.

FIG. 4 shows a bake unit 100 viewed from above; FIG. 5 is a perspective view of the bake unit 100; FIG. 6 shows the bake unit 100 viewed from the side; and FIG. 7 shows a substrate transfer robot 130 and a drive part 140 for transferring substrates in the bake unit 100.

The bake unit 100 of the present disclosure includes: a heater 110 for heating a substrate; a chiller 120 for cooling the substrate; a substrate transfer robot 130 for transferring the substrate; and a controller 150 controlling the operation of the substrate transfer robot 130. The substrate transfer robot 130 an arm base 132 configured to be able to move up and down in the vertical direction Z; and an upper arm 134 and a lower arm 136 coupled to the arm base 132 to move up and down together but be independently horizontally driven.

Figure 7:
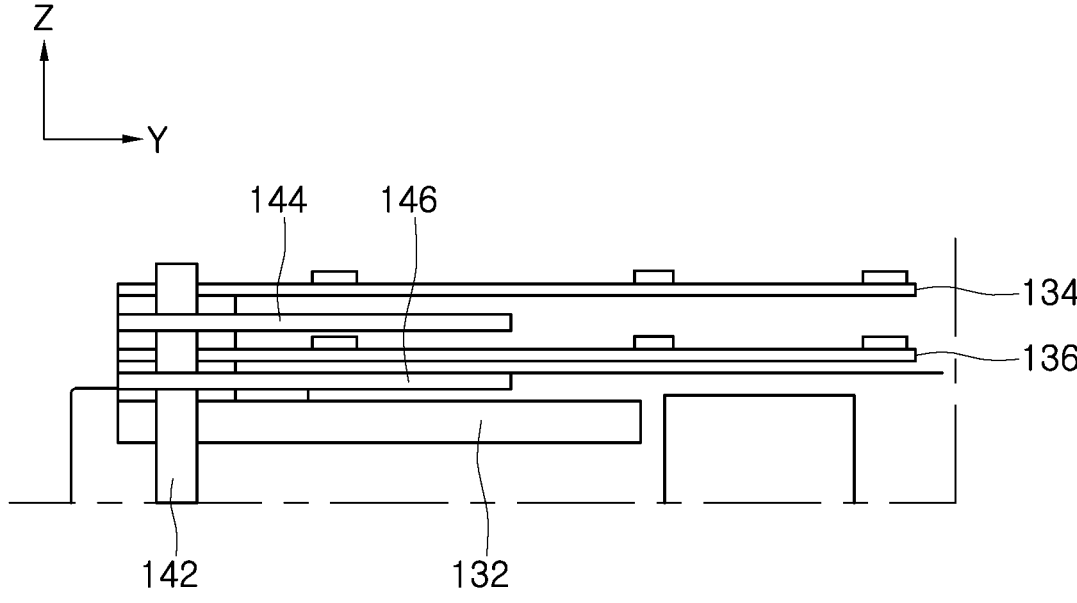
FIG. 7 shows a substrate transfer robot for transferring substrates in the bake unit.

Referring to FIGS. 6 and 7, an arm for handling substrates in the bake unit 100 is composed of the upper arm 134 and the lower arm 136, and the upper aim 134 and the lower arm 136 move up and down together by the arm base 132, but are independently driven horizontally. As such, when a second substrate W2 is put into the bake unit 100 while a first substrate W1 is being heated by the heater 110, the first substrate W1 may be picked up and moved to the chiller 120 by the lower arm 136, and the second substrate W2 may be moved to the heater 110 by the upper arm 134. Thus, since thermal treatment (heating and cooling) may be simultaneously performed on the first substrate W1 and the second substrate W2, the efficiency of the thermal process (substrate throughput per unit time) may be increased.

Referring to FIG. 4, the heater 110 and the chiller 120 are arranged along the second horizontal direction Y on a base plate 160 configured under the bake unit 100. The upper arm 134 and the lower arm 136 may transfer a substrate while moving along the second horizontal direction Y. The heater 110 may be disposed inside a heating chamber 115.

The substrate transfer robot 130 may further include a drive part 140 that drives the substrate transfer robot 130. The drive part 140 may include: an upper arm drive part 144 for moving the upper arm 134 along the second horizontal direction Y; a lower arm drive part 146 for moving the lower arm 136 in the second horizontal direction Y; and a vertical drive part 142 for moving the arm base 132 along the vertical direction Z. The vertical drive part 142, the upper arm drive part 144, and the lower arm drive part 146 may be configured as linear motors or cylinders for linearly moving an object.

The upper aim drive part 144 and the lower arm drive part 146 may be respectively provided on each side of the base plate 160 with the chiller 120 as the center. As shown in FIGS. 4 and 5, the upper arm drive part 144 and the lower arm drive part 146 are respectively disposed on each side of the base plate 160 with the chiller 120 interposed therebetween, and extend along the second horizontal direction Y. The upper arm drive part 144 and the lower arm drive part 146 are respectively adjacent to opposite sides of the base plate 160. When viewed in a plan view, the chiller 120 is disposed in a space between the upper aim drive part 144 and the lower arm drive part 146. The upper arm drive part 144 and the lower arm drive part 146 may be composed of linear motors for moving the upper arm 134 and the lower arm 136.

The vertical drive part 142 is configured to vertically move the upper arm 134 and the lower arm 136 together by raising or lowering the arm base 132. Referring to FIG. 4, the vertical drive part 142 is coupled to the side of the arm base 132 to raise or lower the arm base 132 (the vertical drive part 142 is omitted in FIG. 5). The arm base 132 may be formed in an "angled C" shape when viewed from above, and the chiller 120 may be positioned at the center of the aim base 132.

The upper arm drive part 144 and the lower arm drive part 146 are configured so that the upper arm 134 and the lower aim 136 may move back and forth between a first horizontal position p1 where the chiller 120 is located and a second horizontal position p2 where the heater 110 is located.

Meanwhile, referring to FIGS. 4 and 5, a substrate is put into the upper arm 134 from the external robot hand 3420, and the robot hand 3420 may be formed in a "C" shape open in the first horizontal direction X. At this time, the hand supporting the substrate in the upper arm 134 is formed in a partially open "C" shape, and the opening direction of the hand in the upper arm 134 is opposite to that of the robot hand 3420. The hand supporting the substrate in the lower arm 136 may be formed in a "C" shape open toward the heater 110.

Figure 8:
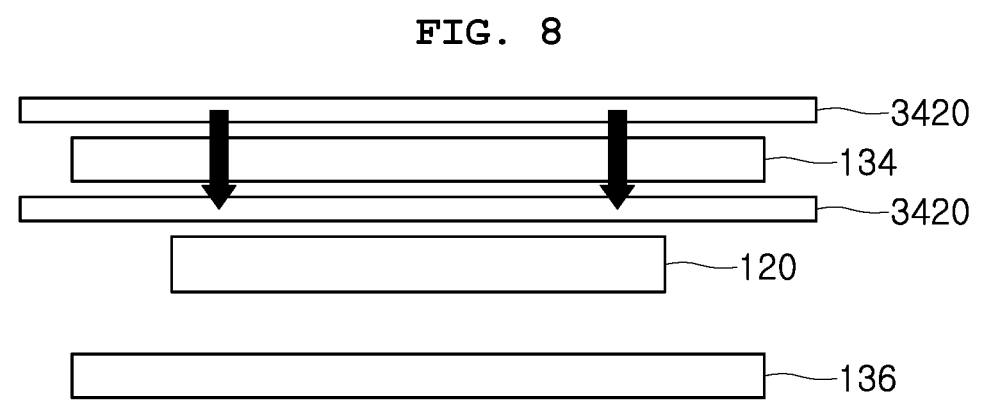

FIG. 8 is a view showing a process of putting down a substrate from the robot hand 3420 to the upper arm 134. After entering the bake unit 100, the robot hand 3420 may descend from above the upper arm 134 toward the upper aim 134 to place a substrate on the upper arm 134.

Figure 9:
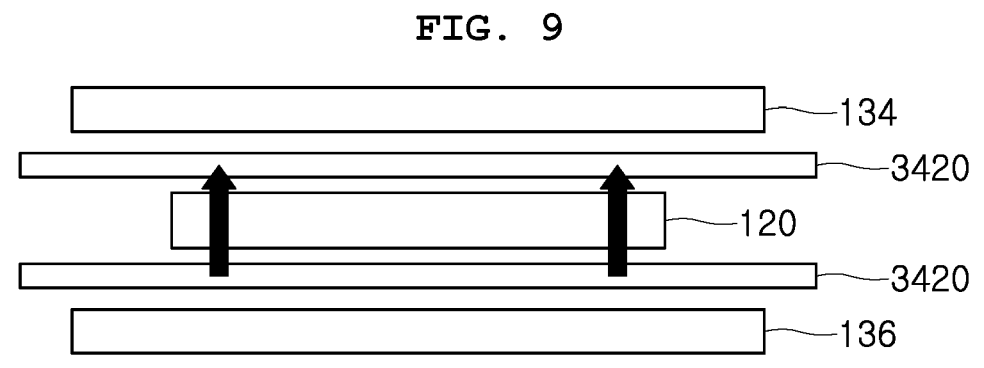

FIG. 9 is a view showing a process of picking up a substrate with the robot hand 3420 from the chiller 120. The robot hand 3420 may pick up a substrate located on the chiller 120 and discharge the substrate to the outside of the bake unit 100.

FIGS. 10 to 13 are flowcharts showing an operation method of the bake unit 100 according to the present disclosure; and FIGS. 14A to 16F are views showing the operation of the bake unit 100 according to the present disclosure. The operation method of the bake unit 100 according to the present disclosure may be executed by the controller 150. In the operation method of the bake unit 100 described with reference to FIGS. 10 to 13, the Nth substrate is referred to as the first substrate W1 and the N+1th substrate is referred to as the second substrate W2.

The operation method of the bake unit 100 includes: placing (S1010) the first substrate W1 on the heater 110 using the upper arm 134; positioning (S1020) the first substrate W1 from the heater 110 to the chiller 120 using the lower arm 136 when the second substrate W2 is input; and placing (S1030) the second substrate W2 on the heater 110 using the upper arm 134.

Figure 10:
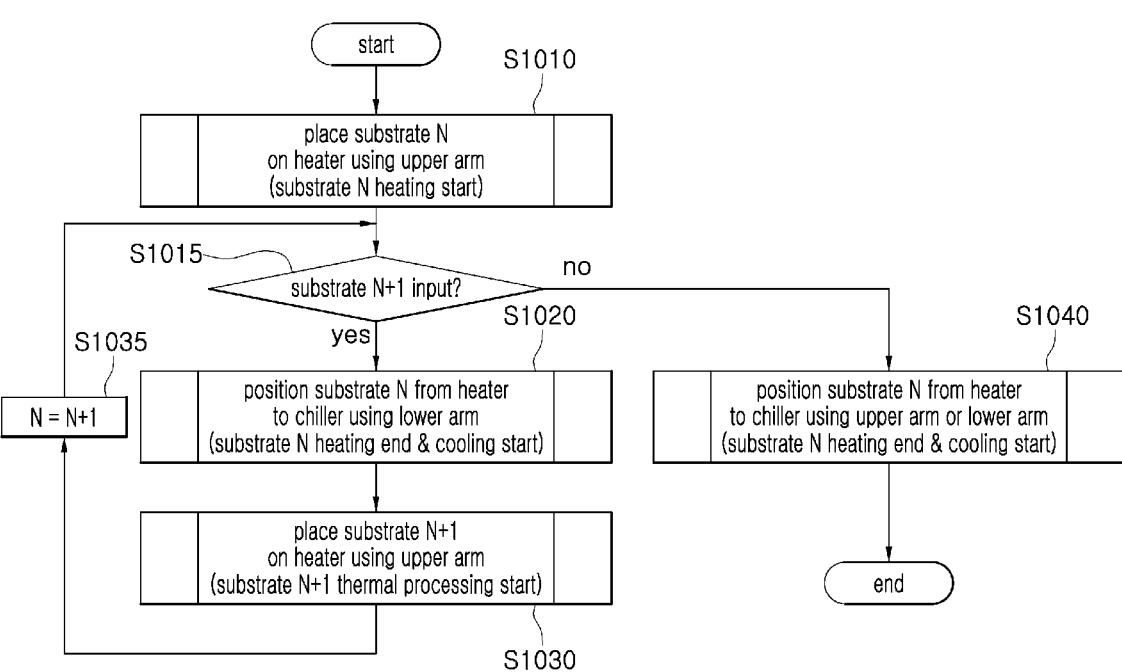

Referring to FIG. 10, after placing (S1010) the first substrate W1 on the heater 110, whether or not the second substrate W2 is input is monitored (S1015). When the second substrate W2 is input, the first substrate W1 is positioned (S1020) from the heater 110 to the chiller 120 using the lower arm 136, and the second substrate W2 is placed (S1030) on the heater 110 using the upper arm 134. When the cooling of the first substrate W1 is completed, the first substrate W1 is discharged to the outside by the robot hand 3420, and the second substrate W2 is treated like a new first substrate W1 (S1035), and then a similar process is repeated. When the second substrate W2 is not input after the step of placing (S1010) the first substrate W1 on the heater, the first substrate W1 is positioned from the heater 110 to the chiller 120 using the upper arm 134 or the lower arm 136, and when cooling is completed, the first substrate W1 is discharged (S1040) to the outside.

The heater 110 is provided with lift pins 112 capable of lifting the substrate to lift the substrate. For example, when the upper aim 134 or the lower arm 136 transfers a substrate to the heater 110, the lift pins 112 of the heater 110 support the substrate, and as the lift pins 112 descend, the substrate may be seated on the heating plate (not shown) of the heater 110. In addition, when the thermal treatment of the substrate is completed, the lift pins 112 rise to lift the substrate, and the upper arm 134 or the lower arm 136 supports and horizontally moves the substrate so that the substrate may be discharged from the heater 110.

Figure 11:
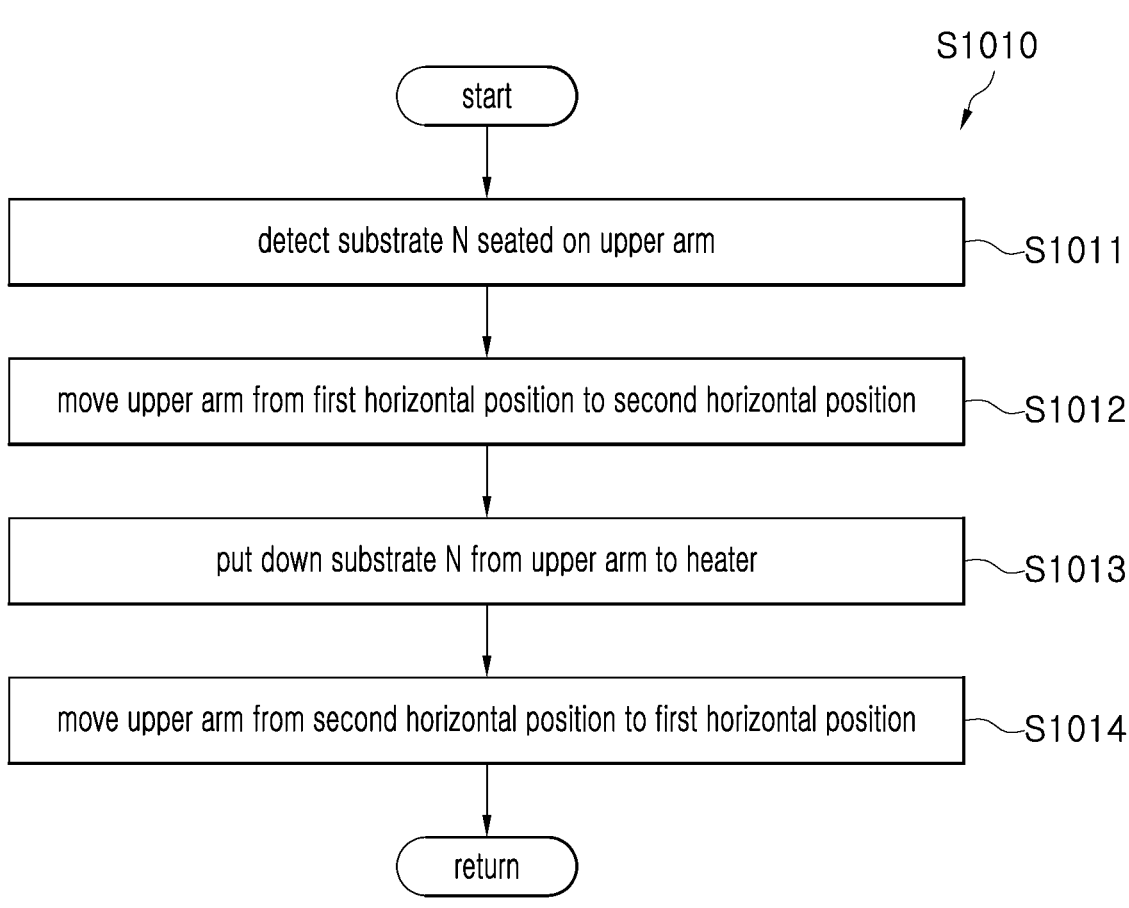

In step S1010, when the first substrate W1 is seated on the upper arm 134, the upper arm 134 moves to the heater 110 to place the first substrate W1 on the heater 110 so that the first substrate W1 may be heated. Referring to FIG. 11, the step of placing (S1010) the first substrate W1 on the heater 110 includes: detecting (S1011) the first substrate W1 seated on the upper arm 134; moving (S1012) the upper arm 134 from the first horizontal position p1 to the second horizontal position p2; putting down the first substrate W1 from the upper aim 134 to the heater 110 (S1013); and moving (S1014) the upper arm 134 from the second horizontal position p2 to the first horizontal position p1.

Figure 14A:
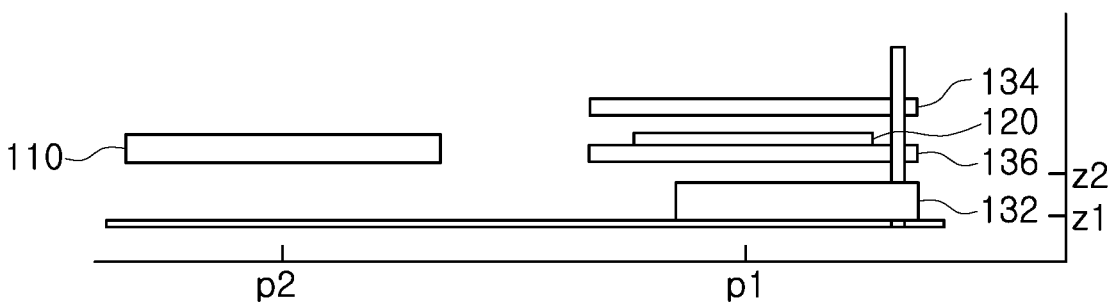
FIGS. 14A to 16F are views showing the operation of the bake unit according to the present disclosure.
Figure 14B:
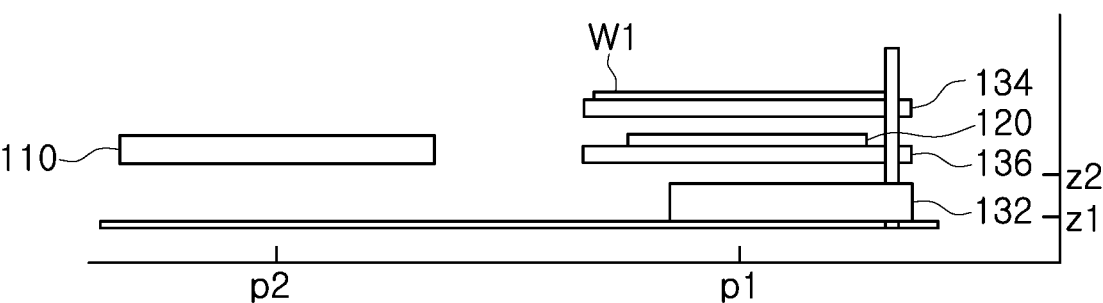
Figure 14C:
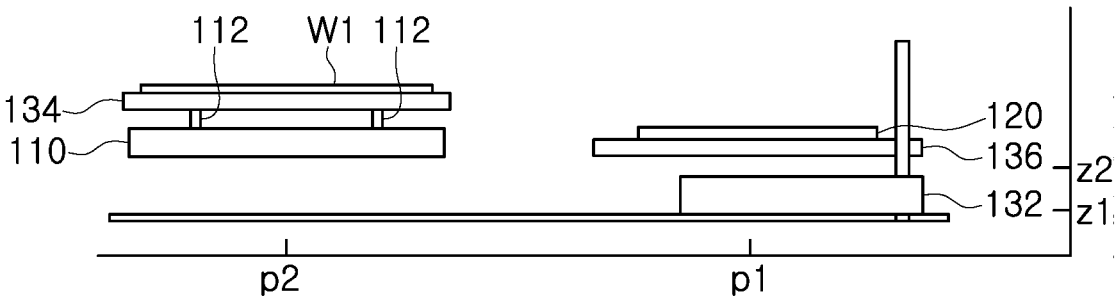
Figure 14D:
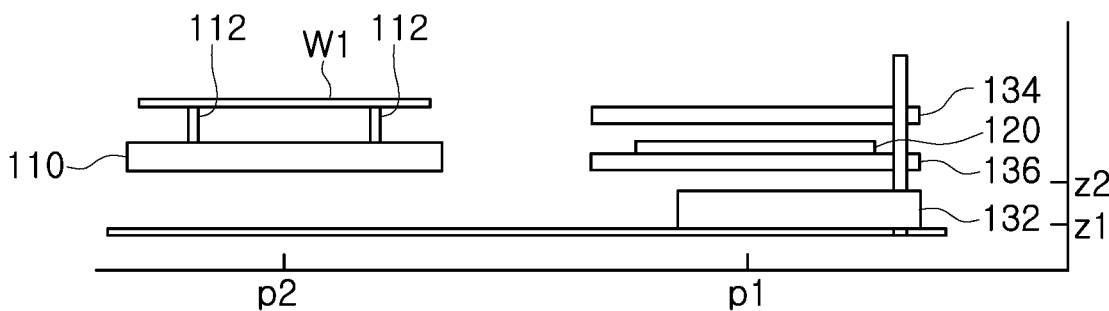
Figure 14E:
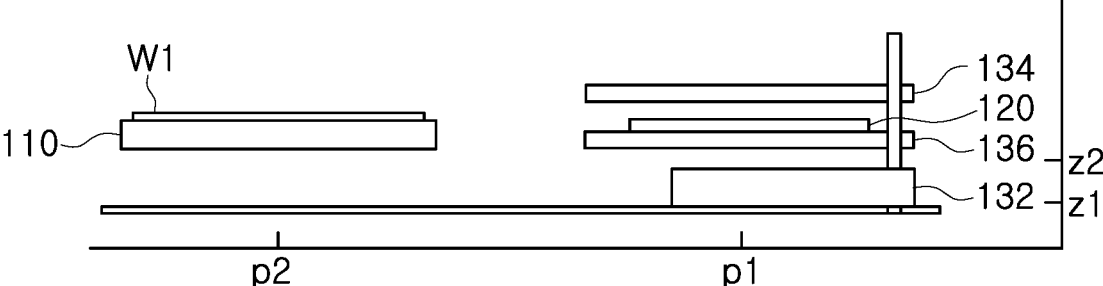

Referring to FIGS. 14A to 14E, when the substrate is not input and is in a standby state, the upper arm 134, the lower arm 136, and the arm base 132 are positioned at their initial positions (FIG. 14A), and the first substrate W1 is transferred to the upper arm 134 by the robot hand 3420 (FIG. 14B). When the first substrate W1 seated on the upper aim 134 is sensed, the upper arm 134 moves from the first horizontal position p1 to the second horizontal position p2, and the first substrate W1 is transferred from the upper arm 134 to the heater 110 (FIG. 14C). The upper arm 134 moves from the second horizontal position p2 to the first horizontal position p1 (FIG. 14D), and the lift pins 112 of the heater 110 descend to allow the first substrate W1 to be seated on the heating plate (FIG. 14E).

Figure 12:
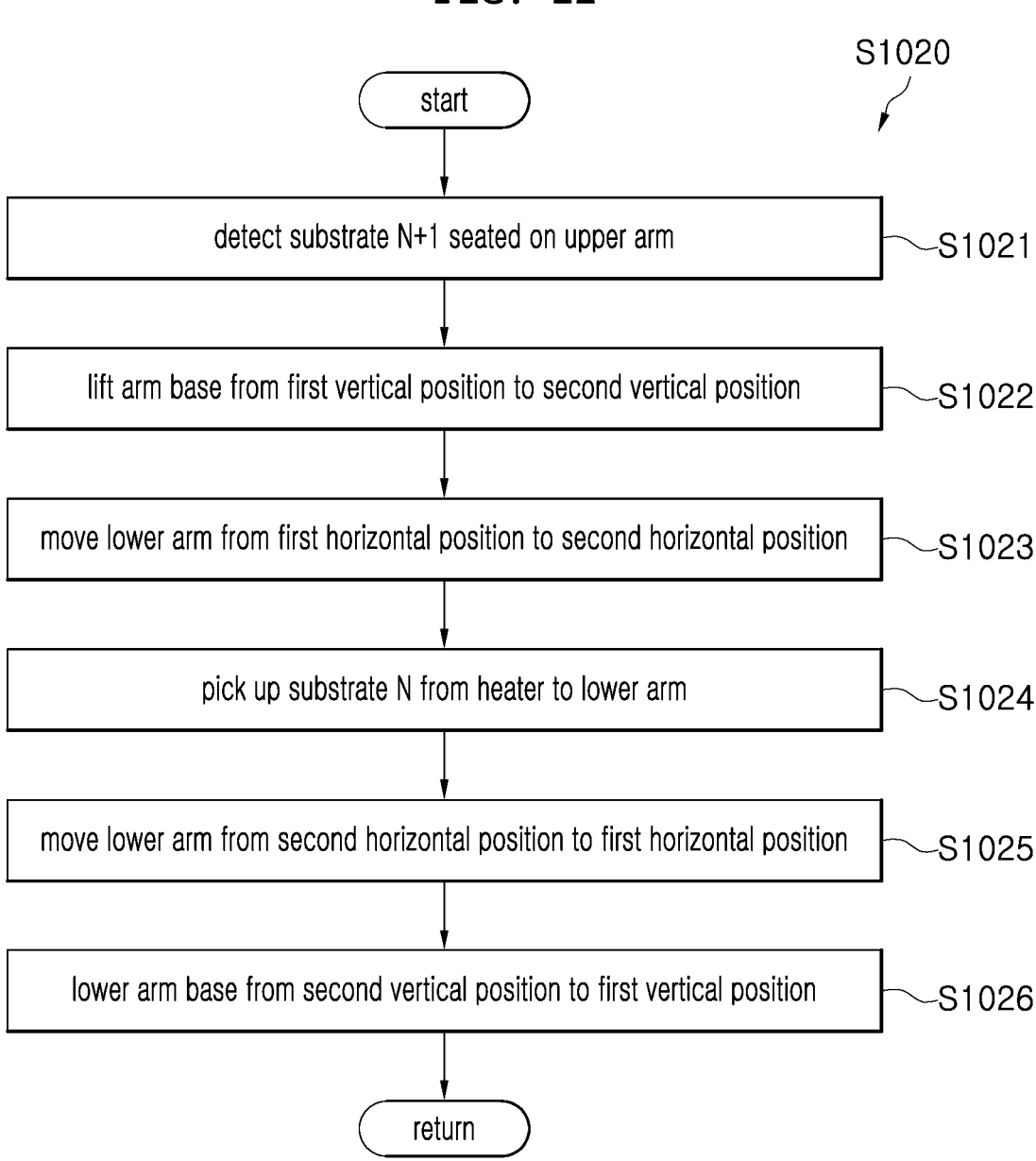

In step S1020, the lower arm 136 may position the first substrate W1 from the heater 110 to the chiller 120 to terminate the heating of the first substrate W1 and start the cooling process. Referring to FIG. 12, positioning the first substrate W1 from the heater 110 to the chiller 120 using the lower arm 136 (S1020) includes: detecting (S1021) the second substrate W2 seated on the upper arm 134; lifting (S1022) the arm base 132 from the first vertical position z1 to the second vertical position z2; moving (S1023) the lower arm 136 from the first horizontal position p1 to the second horizontal position p2; picking up (S1024) the first substrate W1 from the heater 110 to the lower arm 136; moving (S1025) the lower arm 136 from the second horizontal position p2 to the first horizontal position p1; and lowering (S1026) the arm base 132 from the second vertical position z2 to the first vertical position z1.

Figure 15A:
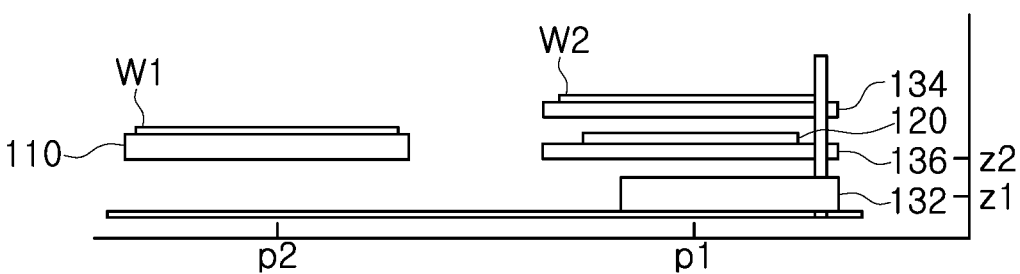
Figure 15B:
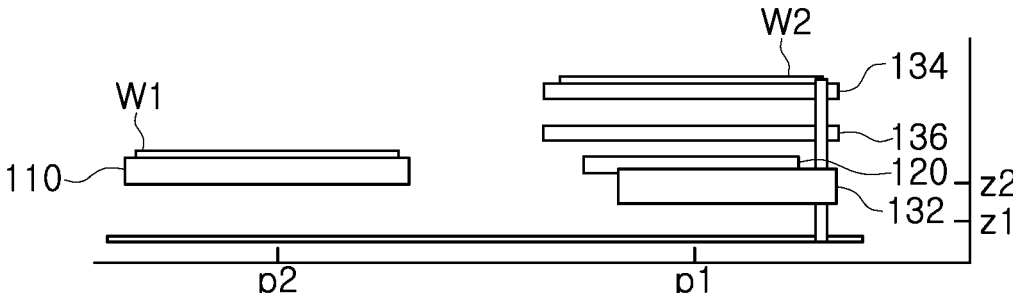
Figure 15C:
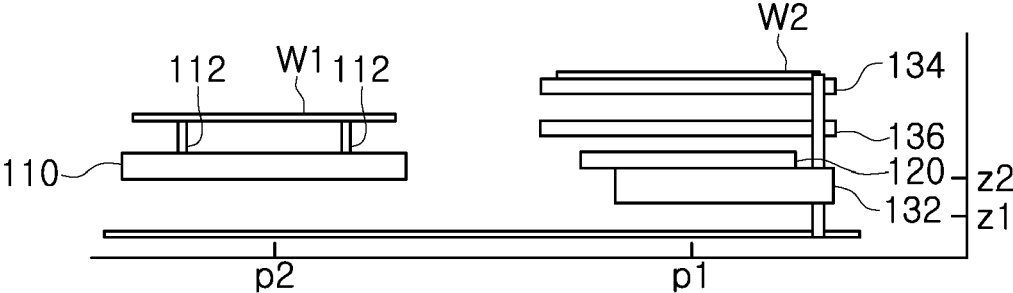
Figure 15D:
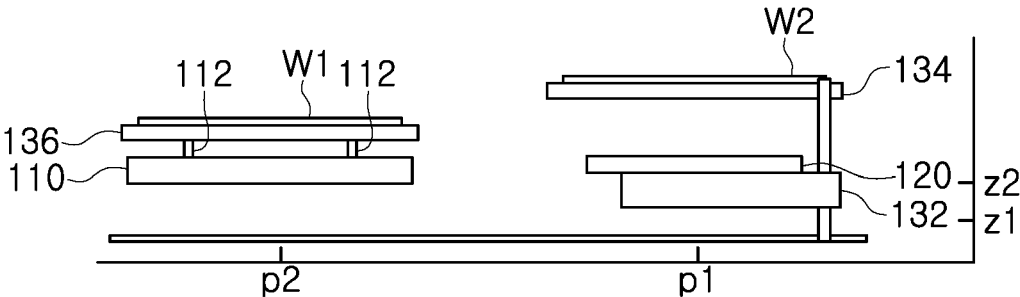
Figure 15E:
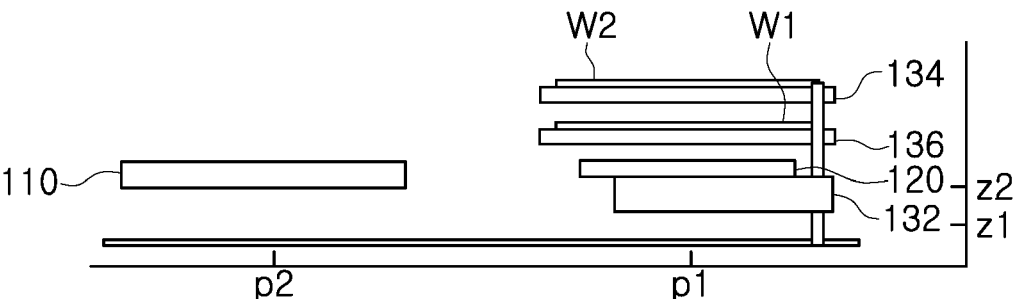
Figure 15F:
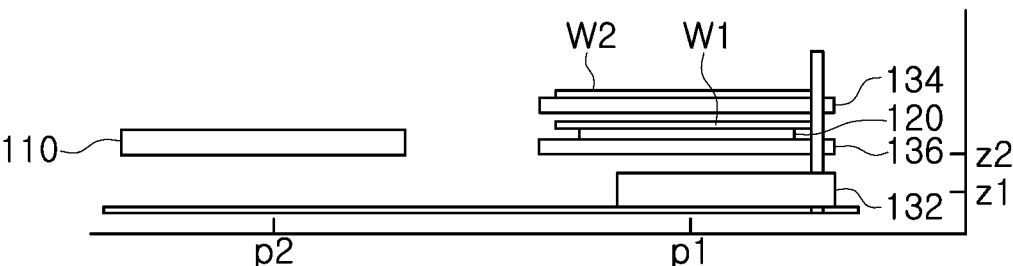

Referring to FIGS. 15A to 15F, while the first substrate W1 is heated by the heater 110, the second substrate W2 is seated on the upper arm 134 (FIG. 15A), and the arm base 132 rises from the first vertical position z1 to the second vertical position z2 so that the upper arm 134 and the lower arm 136 rise (FIG. 15B). When the lift pins 112 of the heater 110 lift the first substrate W1 (FIG. 15C), the lower aim 136 moves from the first horizontal position p1 to the second horizontal position p2 to pick up the first substrate W1 (FIG. 15D). Thereafter, the lower arm 136 holding the first substrate W1 moves from the second horizontal position p2 to the first horizontal position p1 (FIG. 15E), the arm base 132 descends from the second vertical position z2 to the first vertical position z1 so that the second substrate W2 is placed on the chiller 120 from the lower arm 136 (FIG. 15F).

In step S1030, when the first substrate W1 is cooled by the chiller 120, the upper arm 134 horizontally moves to place the second substrate W2 on the heater 110. Placing (S1030) the second substrate W2 on the heater using the upper arm 134 includes: moving (S1031) the upper arm 134 from the first horizontal position p1 to the second horizontal position p2; putting down (S1032) the second substrate W2 from the upper arm 134 to the heater 110; and moving (S1033) the upper arm 134 from the second horizontal position p2 to the first horizontal position p1.

Figure 16A:
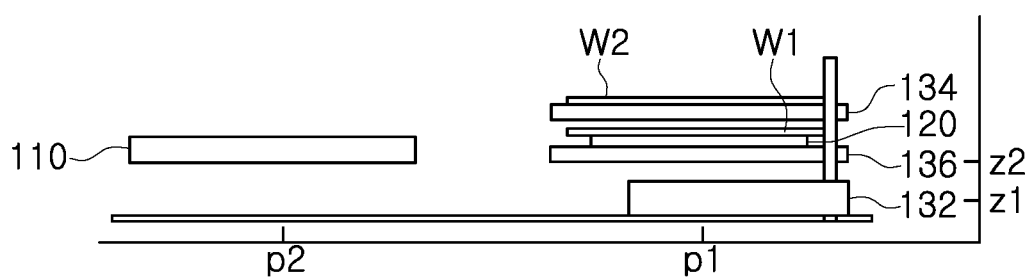
Figure 16B:
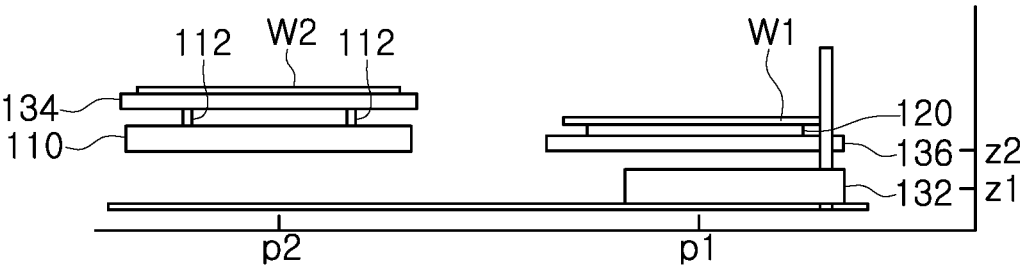
Figure 16C:
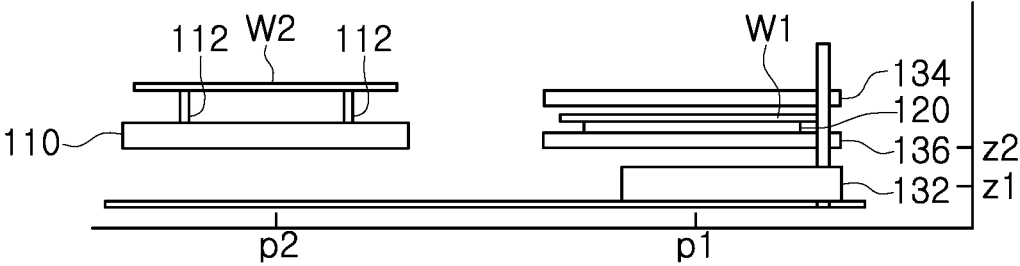
Figure 16D:
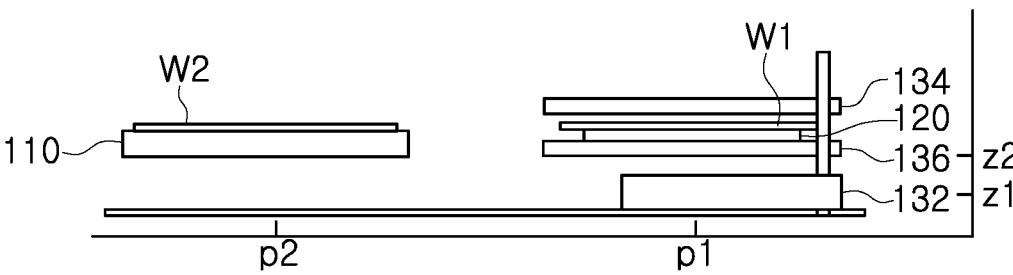
Figure 16E:
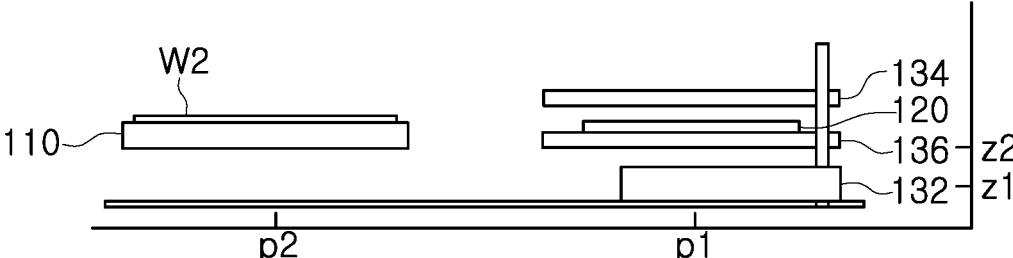
Figure 16F:
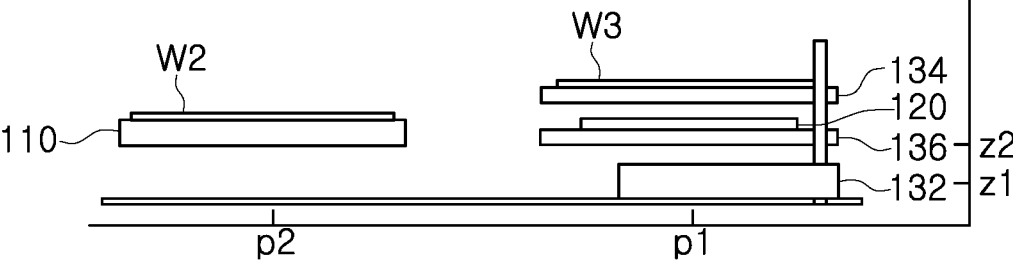

Referring to FIGS. 16A to 16F, when the first substrate W1 is cooled by the chiller 120 (FIG. 16A), the upper arm 134 moves from the first horizontal position p1 to the second horizontal position p2, and the second substrate W2 is transferred from the upper arm 134 to the heater 110 (FIG. 16B). The upper arm 134 moves from the second horizontal position p2 to the first horizontal position p1 (FIG. 16C), the lift pins 112 of the heater 110 descend to allow the second substrate W2 to be seated on the heating plate of the heater 110 (FIG. 16D). When the cooling process for the first substrate W1 is finished, the first substrate W1 is discharged from the chiller 120 to the outside by the robot hand 3420 (FIG. 16E). As shown in FIG. 16F, when a new third substrate W3 is put in, a similar process of transferring the second substrate W2 to the chiller 120 like in the case of the first substrate W1 may be performed.

The present embodiments and the drawings accompanying this specification only clearly show some of the technical ideas included in the present disclosure, and it will be apparent that all modifications and specific embodiments that may be easily inferred by those skilled in the art within the scope of the technical idea included in the specification and drawings of the present disclosure are included in the scope of the present disclosure.

Therefore, the spirit of the present disclosure should not be limited to the described embodiments, and it will be said that not only the claims to be described later but also all things that are equivalent to the claims or have equivalent modifications belong to the scope of the present disclosure.

What is claimed is:

1. A bake unit that performs a thermal process on a substrate in photo spinner equipment, the bake unit comprising:

a heater configured to heat the substrate;

a chiller configured to cool the substrate;

a substrate transfer robot configured to transfer the substrate; and a controller configured to control an operation of the substrate transfer robot, wherein the substrate transfer robot comprises:

an arm base configured to be able to move up and down in a vertical direction; and an upper arm and a lower arm coupled to the arm base to move up and down together but be independently horizontally driven, wherein the arm base is formed in an angled C-shape when viewed in a plan view and supports the upper arm and the lower arm from below, and wherein the chiller is positioned within a central portion of the arm base.

2. The bake unit of claim 1, wherein the substrate transfer robot further comprises a drive part that drives the substrate transfer robot.

3. The bake unit of claim 2, wherein the drive part comprises:

an upper arm drive part configured to move the upper arm along a horizontal direction;

a lower arm drive part configured to move the lower arm in the horizontal direction; and a vertical drive part configured to move the arm base along the vertical direction.

4. The bake unit of claim 3, further comprising:

a base plate on which the upper arm drive part, the lower arm drive part, and the chiller are disposed, wherein the upper arm drive part and the lower arm drive part are respectively adjacent to opposite sides of the base plate, and wherein, when viewed in a plan view, the chiller is disposed in a space between the upper arm drive part and the lower arm drive part.

5. The bake unit of claim 3, wherein the vertical drive part is configured to vertically move the upper arm and the lower arm together by raising or lowering the arm base.

6. The bake unit of claim 3, wherein the upper arm drive part and the lower arm drive part are configured so that the upper arm and the lower arm move back and forth between a first horizontal position where the chiller is located and a second horizontal position where the heater is located.

* * * * *